(12) United States Patent
de la Puente et al.

(10) Patent No.: US 7,262,620 B2
(45) Date of Patent: Aug. 28, 2007

(54) RESOURCE MATRIX, SYSTEM, AND METHOD FOR OPERATING SAME

(75) Inventors: Edmundo de la Puente, Cupertino, CA (US); Alan D. Hart, San Carlos, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/264,577

(22) Filed: Oct. 31, 2005

(65) Prior Publication Data

US 2007/0096757 A1    May 3, 2007

(51) Int. Cl.
*G01R 31/26* (2006.01)
*G01R 31/02* (2006.01)

(52) U.S. Cl. ............... 324/761; 324/754; 324/763; 324/158.1; 714/724; 200/182

(58) Field of Classification Search .......... 324/761, 324/763
See application file for complete search history.

(56) References Cited

U.S. PATENT DOCUMENTS

| | | | |
|---|---|---|---|
| 6,787,719 B2 * | 9/2004 | Wong | 200/182 |
| 6,847,203 B1 * | 1/2005 | Conti et al. | 324/158.1 |
| 2005/0212542 A1 * | 9/2005 | Brown | 324/763 |

OTHER PUBLICATIONS

"Demonstration of the Agilent V5500 with Matrix", www.ate.agilent.com/ext_images/e-mail/AM_001_V5500/V5500demo.html, Sep. 28, 2005, 1 page.
Agilent Versatest Series Model V5500—Product Overview, Agilent Technologies, Jun. 28, 2005, 8 pages.
Agilent Versatest Series Model V5400, Agilent Technologies, Sep. 28, 2005, 3 pages.
Agilent Versatest Series Model V5500, Agilent Technologies, Sep. 28, 2005, 6 pages.
"Memory Test", Agilent Technologies, Sep. 15, 2005, 3 pages.

* cited by examiner

*Primary Examiner*—Ha Tran Nguyen
*Assistant Examiner*—Emily Y Chan

(57) ABSTRACT

In one embodiment, a resource matrix is provided with a first set of pins, a second set of pins, and at least one programmable switching circuit. The first set of pins electrically couples the resource matrix with a tester resource. The second set of pins electrically couples the resource matrix with a plurality of test areas. The at least one programmable switching circuit selectively couples each one of the first set of pins to different ones of the second set of pins. In one embodiment, the at least one programmable switching circuit includes a set of multiplexers. In another embodiment, the at least one programmable switching circuit includes a set of LIMMS. In another embodiment, a system is disclosed for testing a plurality of test areas with a tester resource and a resource matrix. Methods for routing signals between a tester resource and plurality of test areas are also disclosed.

18 Claims, 7 Drawing Sheets

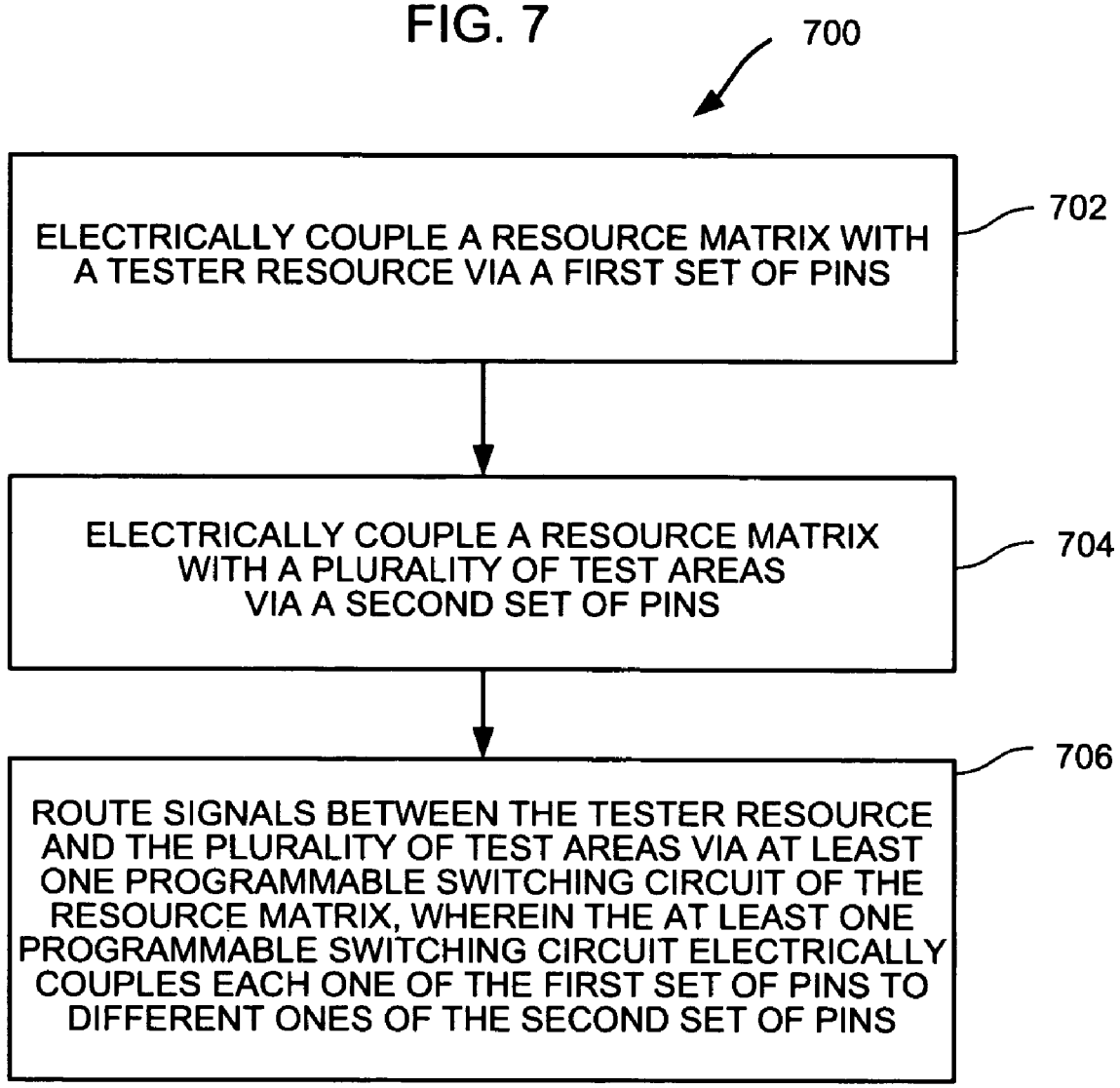

RESOURCE MATRIX, SYSTEM, AND METHOD FOR OPERATING SAME

BACKGROUND

The demand for smaller consumer electronic devices, generally having extensive multimedia applications, increases the need for packing greater functionality into smaller spaces. Because it is not possible to create smaller devices by using chips to 'build out,' it is becoming common to build smaller devices by using chips to 'build up,' or stack the chips or die on top of one another. These stacks of chips or die are referred to as multi-chip packages (MCP's).

While MCP's may solve the density and space problems within devices, they create a variety of new challenges for testing the memory of the devices. MCP's often contain a stack of chips comprised of a variety of different types of memory chips, such as NAND, DRAM, NOR, and SRAM, just to name a few. Thus, it is important to have a reliable, efficient, and cost effective means for testing these different types of memory chips (MCP's) in devices.

SUMMARY OF THE INVENTION

In one embodiment, a resource matrix comprises a first set of pins, a second set of pins, and at least one programmable switching circuit. The first set of pins electrically couples the resource matrix with a tester resource. The second set of pins electrically couples the resource matrix with a plurality of test areas. The at least one programmable switching circuit electrically couples each one of the first set of pins to different ones of the second sets of pins.

In one embodiment, a system comprises a tester resource and a resource matrix. The tester resource tests a plurality of test areas and has an exposed set of pins for coupling the tester resource to a resource matrix. The resource matrix comprises a first set of pins, a second set of pins, and at least one programmable switching circuit. The first set of pins electrically couple the resource matrix with the tester resource via the exposed set of pins. The second set of pins electrically couple the resource matrix with the plurality of test areas. The at least one programmable switching circuit electrically couples each one of the first set of pins to different ones of the second sets of pins.

In another embodiment, a method is disclosed. The method comprises: i) electrically coupling a resource matrix with a tester resource via a first set of pins; ii) electrically coupling the resource matrix with a plurality of test areas via a second set of pins; and iii) routing signals between the tester resource and the plurality of test areas via at least one programmable switching circuit of the resource matrix, wherein the at least one programmable switching circuit selectively couples each one of the first set of pins to different ones of the second sets of pins.

Other embodiments are also disclosed.

BRIEF DESCRIPTION OF THE DRAWINGS

Illustrative and presently preferred embodiments of the invention are illustrated in the drawings, in which:

FIG. 7 illustrates an exemplary method for operating a resource matrix.

DETAILED DESCRIPTION OF AN EMBODIMENT

Figure 1:
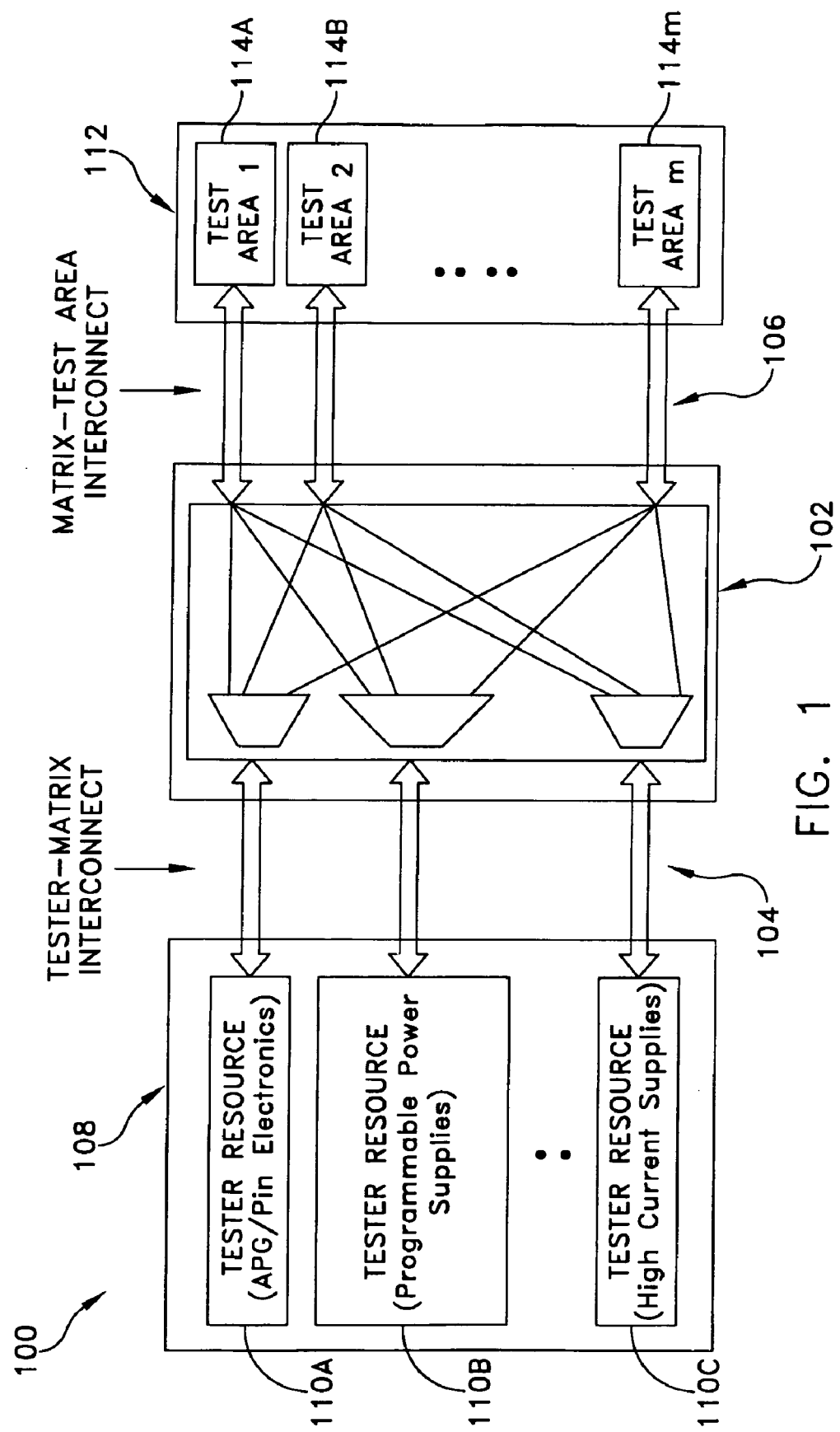
FIG. 1 is a schematic illustration of an embodiment of a system utilizing a resource matrix.

FIG. 1 illustrates an exemplary embodiment 100 of a resource matrix 102 for electrically coupling a tester resource 108 with a plurality of test areas 114A-m for testing by the tester resource 108. Resource matrix 102 may generally have a first set of pins 104 and a second set of pins 106 disposed therein, as shown in FIG. 1. The terms "pins" used he rein refers to devices that provide electrical connections and may include, but are not limited to, pads, pins, balls and receptacles. The first set of pins 104 electrically couples resource matrix 102 with tester resource 108, which is shown as a tester-matrix interconnect 104, and the second set of pins 106 electrically couples resource matrix 102 with a plurality of test areas 114, which is shown as a matrix-tester interconnect 106.

Figure 2:
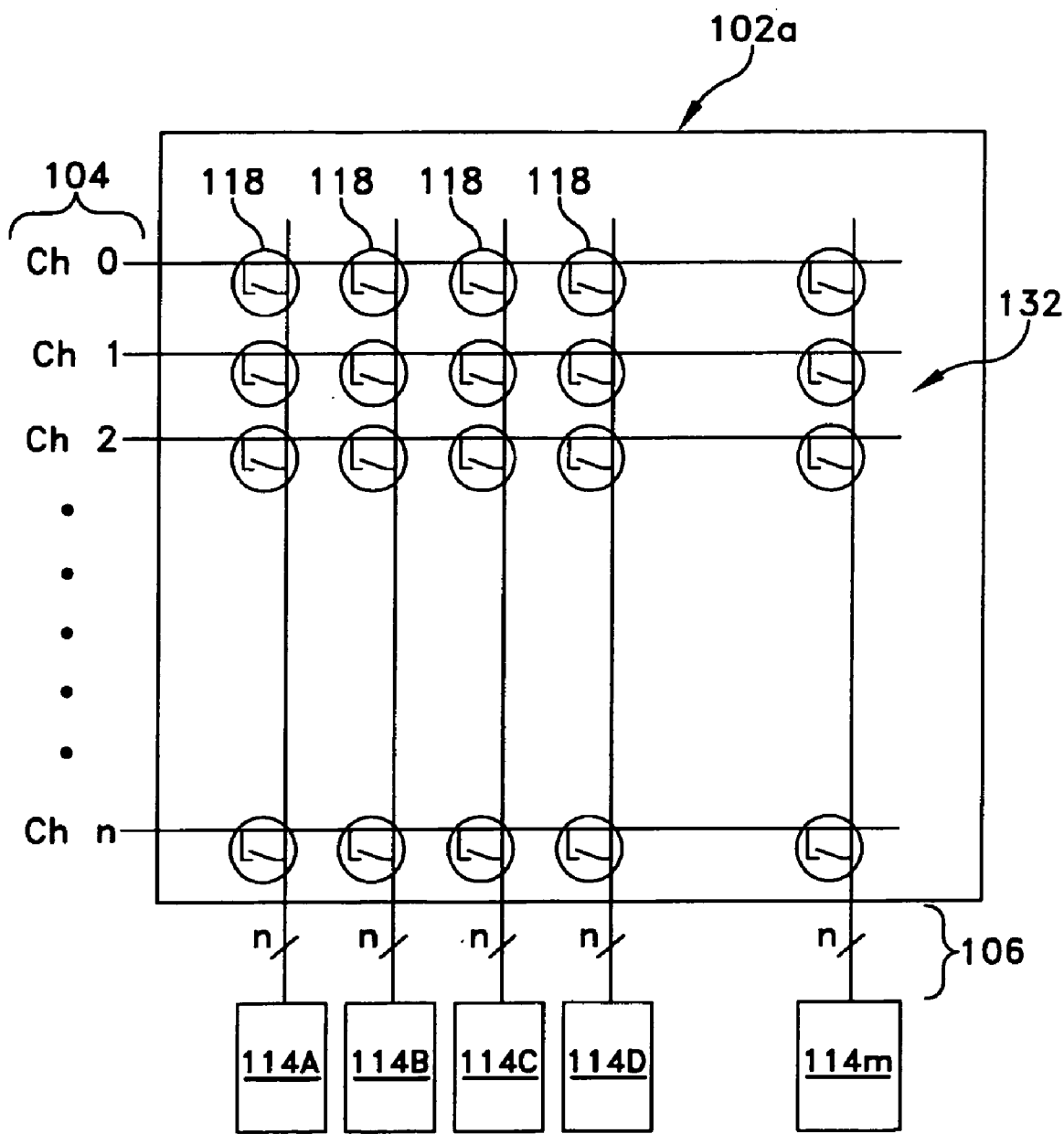
FIG. 2 is a schematic illustration of an embodiment of programmable switching circuits.

The first and second sets of pins 104, 106 may be electrically coupled within resource matrix 102 by programmable switching circuitry 132. The programmable switching circuitry 132 of resource matrix 102a is shown schematically in FIG. 2 as a plurality of switching circuits 118. In an embodiment, a single line from each one of the channels of the first set of pins 104 extends to several switches 118, which is shown in a horizontal direction. Each one of the "n" switches 118 is in turn-connected to an individual line, which is shown as a group of "n" lines in a vertical direction. The group of "n" lines enters into each one of the plurality of test areas 114A-m, respectively. Each of the switching circuits 118 within resource matrix 102a may be operated to selectively couple each one of the first set of pins 104 to different ones of the second sets of pins 106, thus allowing individual channels of the tester resource 108 to selectively couple with different ones of the plurality of test areas 114A-m.

Resource matrix 102 generally provides a per pin switching matrix such that each of the first set of pins 104 may be coupled to any number of the second set of pins 106, which multiplies the functionality of the first set of pins 104. This allows each of the first set of pins 104 to be electrically coupled to a plurality of test areas 114A-m, increasing the flexibility of the first set of pins 104 and allowing a user to test a plurality of devices under test (i.e. test areas 114A-m) in parallel, or test a plurality of different areas of a single device under test (either sequentially, or in parallel).

The first and second sets of pins 104, 106 may comprise a variety of suitable structures, such as bi-directional pins, input pins, output pins, probe-tip pins, spring-pins, or electrical contact points, pads, pins, balls or receptacles, suitable for electrical coupling. In an embodiment, first and second sets of pins 104, 106 may be disposed perpendicularly within resource matrix 102 such that they extend from the surface of resource matrix 102 at a ninety-degree angle suitable for connecting with a tester resource 108 and the plurality of test areas 114A-m. In another embodiment, first and second sets of pins 104, 106 may include flush mounted pads or other structures in which the "pins" do not extend perpendicularly from resource matrix 102. First and second sets of pins 104, 106 may be arranged in any number of configurations and may be grouped into multiple sets and/or integrated into other connecting mechanisms.

Tester resource 108 may comprise any suitable tester and may be test equipment suitable for testing memory of a device or devices under tests. The tester may be suitable for testing a variety of different test areas 114A-m having a variety of different types of memory, such as NAND, DRAM, NOR, and SRAM, just to name a few. Tester resource 108 may also comprise any number of signal pathways or resources 110 for electrically coupling tester resource 108 to the first set of pins 104 on the resource matrix 102. For example, tester resources 110 may include, but are not limited to APG/pin electronics 110A, programmable power supplies 110B, and high current supplies 110C.

The plurality of test areas 114A-m may comprise any number of test areas 114A-m arranged in number of configurations. Test areas 114A-m may be positioned in a linear arrangement or stacked on top of one another and electrically coupled to one another, similar to a MCP. In one embodiment, the plurality of test areas 114A-m may be a single device under test (DUT) having multiple test areas, i.e., a plurality of chips or an MCP. In another embodiment, the DUT may comprise a plurality of devices, wherein each of which has one or more test areas.

Figure 3:
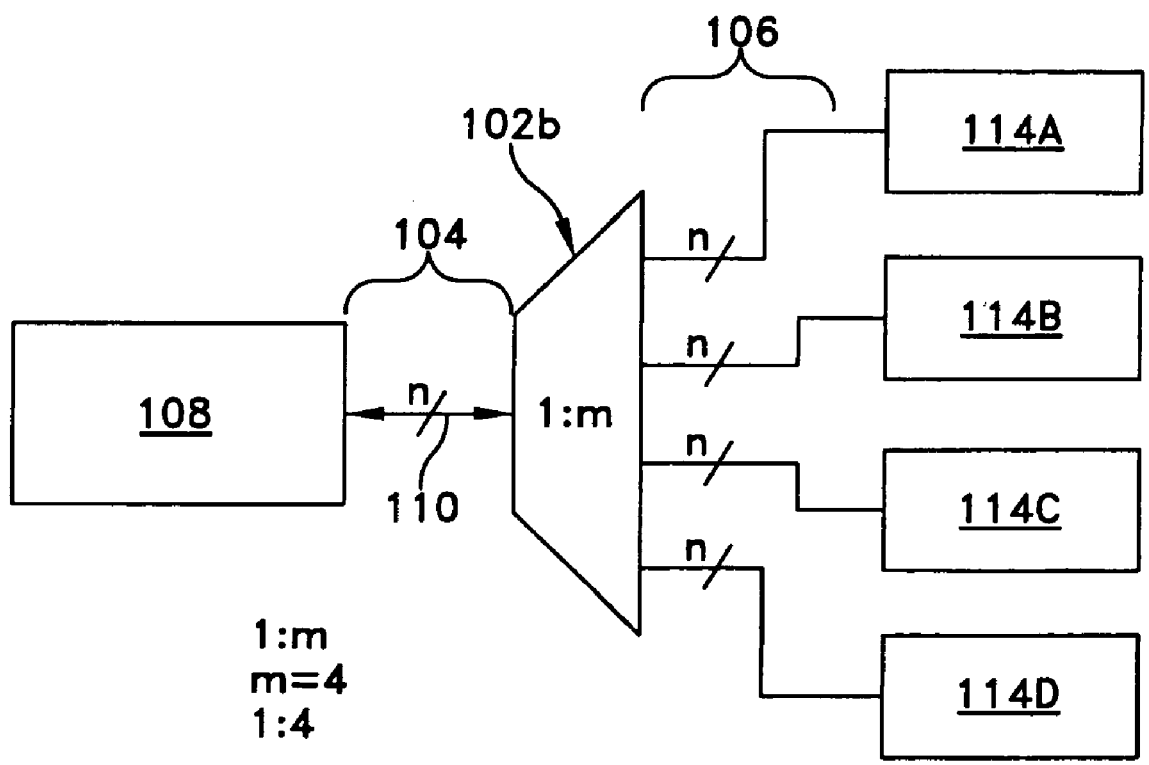
FIG. 3 illustrates a first exemplary embodiment of a resource matrix.
Figure 4:
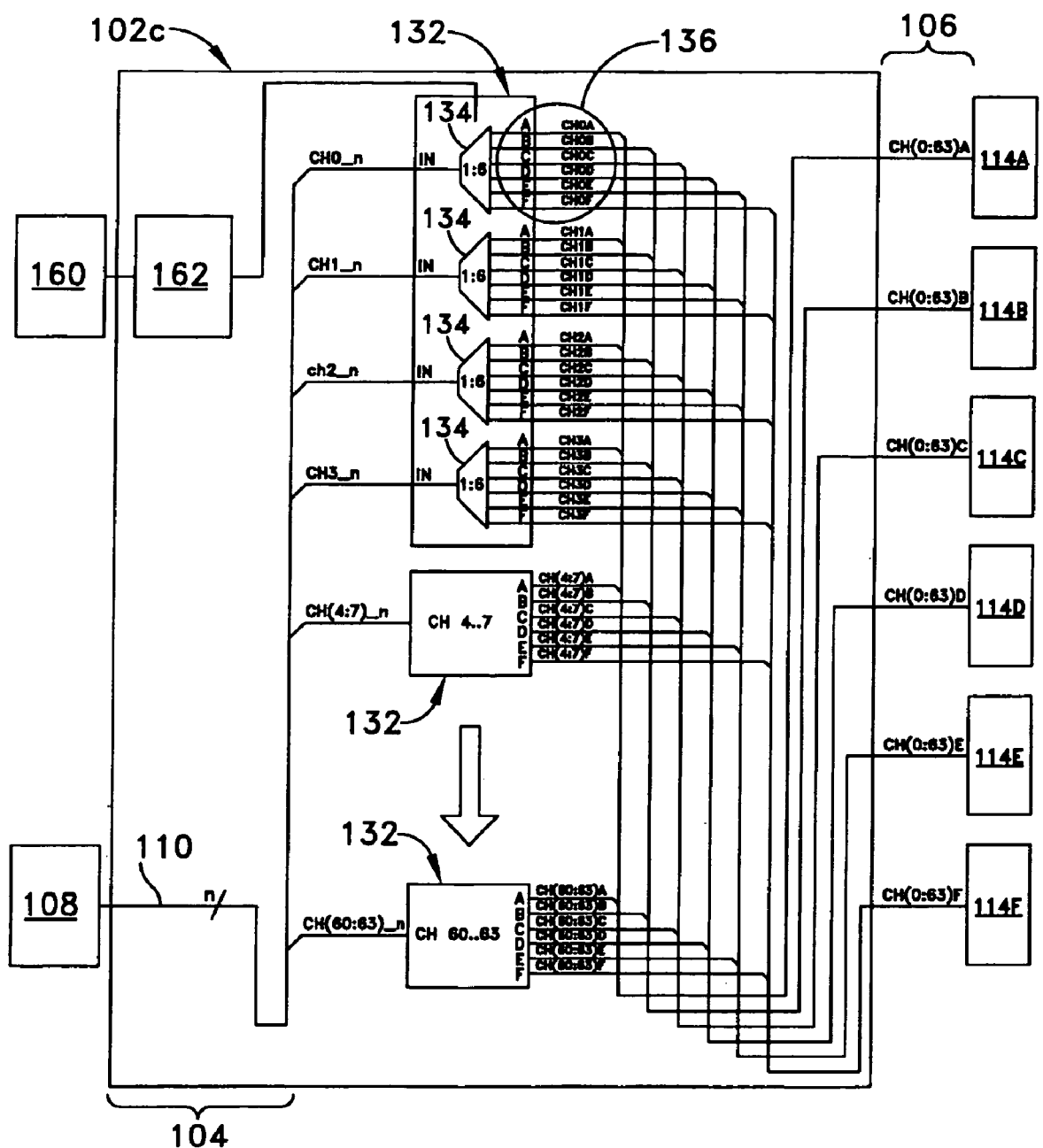
FIG. 4 is a schematic illustration of an embodiment of the resource matrix of FIG. 3.

As shown in FIGS. 3 and 4, the resource matrix 102b or 102c may be coupled to tester resource 108 via the first set of pins 104, which may be any number (n) of pins (i.e. channels or signal pathways). Resource matrix 102b may comprises at least one programmable switching circuit 132 (shown in FIG. 4) which multiplies each pin 104 by a factor of "M." In some embodiments "M" may represent the number of test areas 114A-m, i.e. "M" may equal 4 for test areas 114A, 114B, 114C, and 114D.

As shown in FIGS. 3 and 4, "1:M" may represent the ratio between the number of pins 104 going into one side of resource matrix 102b (FIG. 2), or resource matrix 102c (FIG. 3), and the number of pins 106 going out of the other side of the resource matrix 102b (FIG. 2), or resource matrix 102c (FIG. 3). For example, as shown in FIG. 3, the resource matrix 102b may comprise a pin count ratio of 1:M for each of the switching circuits 132, where M=4 (i.e. the number of DUTs or test areas 114A-114D), and where the relationship between the total number of the first set of pins 104 to the second set of pins 106 is 1:4.

In one embodiment, as shown in FIG. 4, resource matrix 102c may also comprise at least one programmable switching circuit 132. In one embodiment, the programmable switching circuit 132 may comprise a set of multiplexers 134. Each one of the set of multiplexers 134 may have a single connection (e.g., CH0_n of the connections shown as CH0_n-CH(60:63_n)) to one of the first sets of pins 104. Each one of the set of multiplexers 134 may also comprise a set of multiple connections 136 (e.g., CH0A to CH0F of multiplexer 134 with the single connection identified as CH0_n) to the second set of pins 106, wherein each one of the set of multiplexers 134 selectively couples one of the first set of pins 104 to different ones of the second set of pins 106. In one embodiment, the at least one programmable switching circuit 132 may have one multiplexer 134 for each one of the first set of pins 104 coupling the resource matrix 102c to the tester resource 108.

With continuing reference to FIG. 4, the resource matrix 102c may be operably associated with a control system 160/162, which may comprise a controller 162 and/or a central processing unit 160. The control system 160/162 may be operably associated with the multiplexers 134 to control switches 140 (FIG. 5) within the multiplexers 134, which will now be described in more detail.

Figure 5:
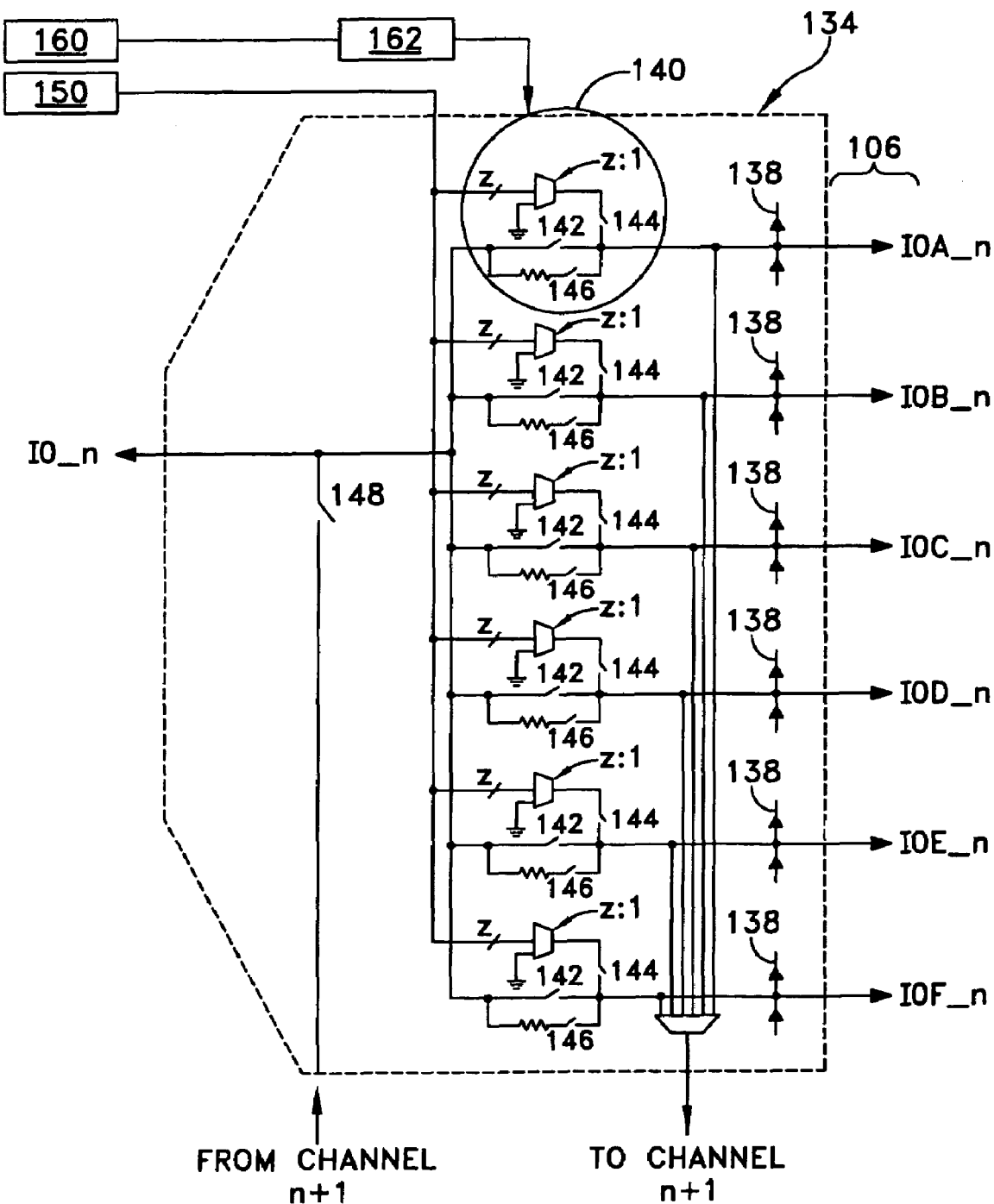
FIG. 5 illustrates an electrical circuit diagram of one multiplexer of the resource matrix of FIG. 4.

As shown in FIG. 5, each multiplexer 134 may be operable to switch from a single one input pin 104 (from one of the first set of pins 104) into one or more of a plurality of output pins 106. The multiplexer 134 may separate the pins 104 and multiply the number of pins 104 being coupled to the test areas 114. The multiplexer 134 may comprise a number of sets of switches 140 for selectively coupling each one of the first set of pins 104 to different ones of the second set of pins 106. Each one of the sets of switches 140 may be used to couple one of the first set of pins 104 to different ones of the second set of pins 106.

As shown in FIG. 5, each of the sets of switches 140 may comprise three switches 142, 144, 146. Each of the sets of switches 140 may have the same number, arrangement, and type of switches so only one set of switches 140 will be described herein for simplicity. Main switch 142 allows coupling of the tester resource 108 to any one of the test areas 114A-F. Main switch 142 may have a minimal resistance of 12Ω or less. Switches 142 and 146 are mutually exclusive. When switch 142 is open, switch 146 may be closed to provide a resistance of between approximately 450Ω-500Ω and may isolate capacitance and limit the amount of current a device under test output is required to drive. When switch 142 is open, switch 144 may be closed to connect a voltage as discussed below.

The set of switches 140 may be controlled by control system 160/162 which may comprise central processing unit 160 and controller 162 to operably control when specific switches 140 should change or remain in position (i.e. open or closed). The set of switches 140 may also be operably associated with a power source 150 to provide a voltage to one or more of pins 106 via the switch 144. As shown in FIG. 5, the voltage power source 150 may provide a default voltage to switch 144. A user may alter this default voltage to one of a number "z" of different preset voltages, or may select an additional ground position.

As shown in FIG. 5, each of the second sets of pins 106 may also have a device, such as a pair of diodes 138, for protecting against electrostatic discharge (ESD). The pair of diodes 138 for protecting against ESD may be positioned on the line of each of the second set of pins 106, between the line power, and between the line and ground, respectively. The ESD protection protects the second set of pins 106 from stray static charges to prevent system damage and to increase system reliability.

Figure 6:
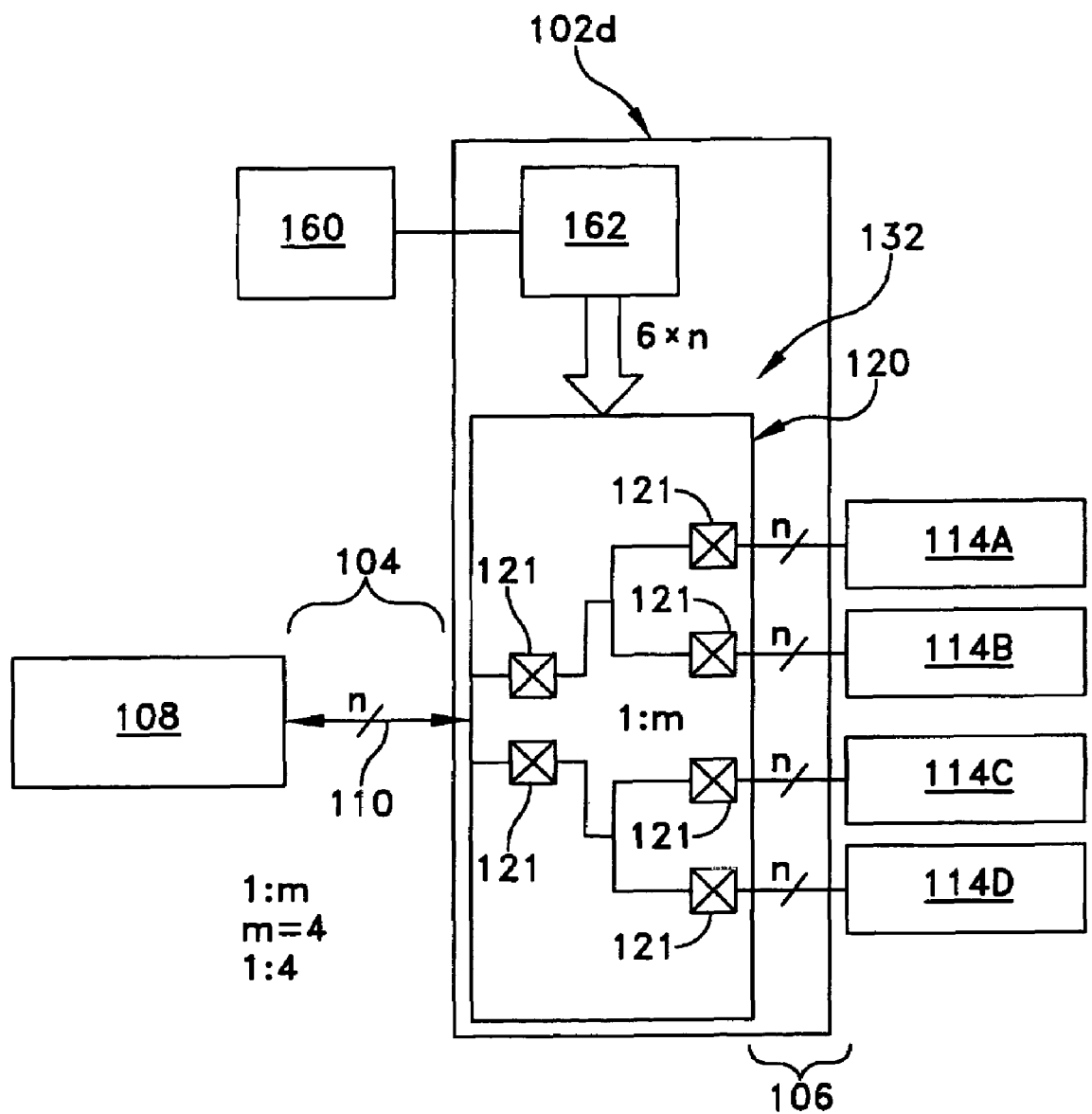
FIG. 6 illustrates a second exemplary embodiment of a resource matrix.

In another embodiment, as shown in FIG. 6, the at least one programmable switching circuit 132 may comprise a set of liquid metal micro-switches (LIMMS) 120. LIMMS 121 of the set of LIMMS 120 may be implemented in place of the multiplexers 134 illustrated in FIG. 5, but may be stacked on top of one another to provide a more direct route to the test areas 114 (shown generally in FIG. 6). LIMMS 121 may be arranged in a tree or branching configuration, to maintain the signal path integrity and to minimize the lumped parasitic capacitance on the other LIMMS 121. LIMMS generally provide a very high speed, high fidelity solution having large bandwidths of up to 20 Ghz.

Similar to the embodiment having the set of multiplexers 134 described above, the set of LIMMS 120 may have a single connection for each channel of the first set of pins 104, and the set of LIMMS 120 may also comprise a set of multiple connections 136 (shown in FIG. 4) for each channel of the second set of pins 106. This allows each one of the set of LIMMS 120 to selectively couple one of the first set of pins 104 to different ones of the second set of pins 106. In one embodiment, the at least one programmable switching circuit 132 may have one set of LIMMS 120 for each one of the first set of pins 104 coupling the resource matrix 102*d* to the tester resource 108. For example, there is one LIMMS 121 at the end of each branch of the set of LIMMS 120. One or more LIMMS 121 are actuated to selectively allow transmission of signals along one or more pathways between tester resource 108 and test areas 114.

In one exemplary embodiment a system comprising a tester resource 108 and a resource matrix 102 is disclosed. As described above, the tester resource 108 tests a plurality of test areas 114 and has an exposed set of pins for coupling the tester resource 108 to a resource matrix 102. The resource matrix 102 may comprise first set of pins 104, second set of pins 106, and at least one programmable switching circuit 132, as described above. At the system level, and in one embodiment, it may be important to position the resource matrix 102 as close as possible to the test areas 114, to minimize unwanted signal reflections.

As shown in FIG. 7, in one embodiment, a resource matrix may be used to route signals between a tester resource and a plurality of test areas. A method 700 may comprise: i) electrically coupling 702 a resource matrix with a tester resource via a first set of pins; ii) electrically coupling 704 a resource matrix with a plurality of test areas via a second set of pins; and iii) routing 706 signals between the tester resource and the plurality of test areas via at least one programmable switching circuit of the resource matrix, wherein the at least one programmable switching circuit selectively couples each one of the first set of pins to different ones of the second set of pins.

Method 700 of routing signals between the tester resource and the test areas via the resource matrix may be done utilizing an embodiment having sets of multiplexers thereon or using the embodiment having sets of LIMMS thereon, as described above. Method 700 may further comprise activating a control system to control the selective coupling between each one of the first set of pins and different ones of the second sets of pins.

In one embodiment, a control system may be programmed to selectively actuate the switches of the resource matrix before routing the signals between the tester resource and the plurality of test areas. In another embodiment, the control system may be programmed to selectively actuate the switches of one or more channels of the resource matrix while routing signals of one or more other channels through the matrix between the tester resource and the plurality of test areas.

What is claimed is:

1. A resource matrix, comprising:
a first set of pins for electrically coupling the resource matrix with a tester resource;
a second set of pins for electrically coupling the resource matrix with a plurality of test areas; and
at least one programmable switching circuit to electrically couple each one of the first set of pins to different ones of the second set of pins, a set of LIMMS in the at least one programmable switching circuit, and the LIMMS having a connection to one of the first set of pins and a set of multiple connections to the second set of pins, wherein the LIMMS couples the one of the first set of pins to selected ones of the second set of pins.

2. The resource matrix of claim 1, wherein the at least one programmable switching circuit has one set of LIMMS for each one of the first set of pins coupling the resource matrix to the tester resource.

3. The resource matrix of claim 1, further comprising a control system operably associated with each one of the set of LIMMS, wherein the control system controls operation of each one of the set of LIMMS.

4. The resource matrix of claim 1, wherein the plurality of test areas comprise a multi-chip package, wherein the plurality of test areas are disposed on a plurality of individual chips of the multi-chip package, and wherein the at least one programmable switching circuit selectively couples each one of the second set of pins to different individual chips of the multi-chip package.

5. The resource matrix of claim 1, wherein the plurality of test areas comprise a plurality of multi-chip packages, wherein the plurality of test areas are disposed on a plurality of individual chips of the plurality of multi-chip packages, and wherein the at least one programmable switching circuit selectively couples each one of the second set of pins to one of the plurality of individual chips of the plurality of multi-chip packages.

6. The resource matrix of claim 1, wherein at least two LIMMS of the set of LIMMS are stacked so as to provide a substantially direct route between the tester resource and the plurality of test areas.

7. The resource matrix of claim 1, wherein the set of LIMMS provide a high speed, high fidelity connection for bandwidths of up to 20 Ghz between the tester resource and the plurality of test areas.

8. A system, comprising:
a tester resource for testing a plurality of test areas having an exposed set of pins for coupling the tester resource to a resource matrix; and
the resource matrix, comprising:
a first set of pins for electrically coupling the resource matrix with the tester resource via the exposed set of pins;
a second set of pins for electrically coupling the resource matrix with the plurality of test areas; and
at least one programmable switching circuit to electrically couple each one of the first set of pins to different ones of the second set of pins, a set of LIMMS in the at least one programmable switching circuit, and the LIMMS having a connection to one of the first set of pins and a set of multiple connections to the second set of pins, wherein the LIMMS couples the one of the first set of pins to selected ones of the second set of pins.

9. The system of claim 8, further comprising a control system operably associated with the resource matrix for controlling operation of the at least one programmable switching circuit.

10. The system of claim 8, wherein the at least one programmable switching circuit has one set of LIMMS for each one of the first set of pins coupling the resource matrix to the tester resource.

11. The system of claim 8, wherein the plurality of test areas comprise a multi-chip package, wherein the plurality of test areas are disposed on a plurality of individual chips of the multi-chip package, and wherein the at least one programmable switching circuit selectively couples each one of the second set of pins to different individual chips of the multi-chip package.

12. The system of claim 8, wherein the plurality of test areas comprise a plurality of multi-chip packages, wherein the plurality of test areas are disposed on a plurality of individual chips of the plurality of multi-chip packages, and wherein the at least one programmable switching circuit selectively couples each one of the second set of pins to one of the plurality of individual chips of the plurality of multi-chip packages.

13. The system of claim 8, wherein at least two LIMMS of the set of LIMMS are stacked so as to provide a substantially direct route between the tester resource and the plurality of test areas.

14. The system of claim 8, wherein the set of LIMMS provide a high speed, high fidelity connection for bandwidths of up to 20 Ghz between the tester resource and the plurality of test areas.

15. A method, comprising:
electrically coupling a resource matrix with a tester resource via a first set of pins;
electrically coupling the resource matrix with a plurality of test areas via a second set of pins; and
routing signals between the tester resource and the plurality of test areas via at least one programmable switching circuit of the resource matrix, wherein the at least one programmable switching circuit selectively couples each one of the first set of pins to different ones of the second set of pins, wherein a set of LIMMS is provided in the at least one programmable switching circuit, and the LIMMS has a connection to one of the first set of pins and a set of multiple connections to the second set of pins, and wherein the set of LIMMS couples the one of the first set of pins to selected ones of the second set of pins.

16. The method of claim 15, further comprising activating a control system before routing signals between the tester resource and the plurality of test areas to control selectively coupling each one of the first set of pins to different ones of the second set of pins.

17. The method of claim 15, wherein the routing signals between the tester resource and the plurality of test areas via at least one programmable switching circuit of the resource matrix includes at least two LIMMS of the set of LIMMS stacked so as to provide a substantially direct route between the tester resource and the plurality of test areas.

18. The method of claim 15, wherein the routing signals between the tester resource and the plurality of test areas via at least one programmable switching circuit of the resource matrix includes the set of LIMMS with a high speed, high fidelity connection for bandwidths of up to 20 Ghz between the tester resource and the plurality of test areas.

* * * * *